(12) United States Patent
Abe (10) Patent No.: US 8,565,032 B2
(45) Date of Patent: Oct. 22, 2013

(54) SEMICONDUCTOR DEVICE (75) Inventor: Tsuneo Abe, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 238 days.

(21) Appl. No.: 13/064,613

(22) Filed: Apr. 4, 2011

(65) Prior Publication Data
US 2011/0249521 A1 Oct. 13, 2011

(30) Foreign Application Priority Data

Apr. 9, 2010 (JP) ................. 2010-090232

(51) Int. Cl.
*G11C 7/00* (2006.01)
(52) U.S. Cl.
USPC ..................... 365/193; 365/233.12
(58) Field of Classification Search
USPC ........................... 365/193, 233.12
See application file for complete search history.

(56) References Cited

U.S. PATENT DOCUMENTS 7,372,745 B2 * 5/2008 Kitamura ................ 365/189.05
RE43,539 E 7/2012 Takahashi

FOREIGN PATENT DOCUMENTS

JP 2008-112565 5/2008

* cited by examiner

*Primary Examiner* — Son Dinh
*Assistant Examiner* — Nam Nguyen
(74) *Attorney, Agent, or Firm* — McGinn IP Law Group, PLLC

(57) ABSTRACT

A semiconductor device includes: a clock generator generating a first internal clock signal based on an external clock signal; a clock divider generating second and third internal clock signals based on the first internal clock signal and including an edge adjustor adjusting a timing of one of rising and falling edges of the third internal clock signal, an adjustment information holder supplying an edge adjustment signal to the edge adjustor, and a data strobe generator receiving the second and third internal clock signals to generate a first data strobe signal based on the second internal clock signal, and a second data strobe signal with a phase different from that of the first data strobe signal, based on the third internal clock signal. The edge adjustor adjusts the timing of at least one of the rising and falling edges of the third internal clock signal based on the edge adjustment signal.

17 Claims, 8 Drawing Sheets

SEMICONDUCTOR DEVICE

This application is based upon and claims the benefit of priority from Japanese patent application No. 2010-90232, filed on Apr. 9, 2010, the disclosure of which is incorporated herein in its entirety by reference.

BACKGROUND OF THE INVENTION

1. Field of the Invention

The present invention relates to a semiconductor device, and in particular, to a semiconductor device that uses a data strobe signal.

2. Description of Related Art

The frequency of data transfer between a plurality of semiconductor devices, for example, between a semiconductor memory device and a memory controller, has been increasing year by year. Thus, in order to show data loading timing, improvement of accuracy of a data strobe signal has been more and more important; the data strobe signal is fed from a data-outputting semiconductor device (for example, the semiconductor memory device) to a data-receiving semiconductor device (for example, the memory controller) together with data.

JP2008-112565A discloses a semiconductor device that uses as a data strobe signal two data strobe signals with different phases (these signals are hereinafter referred to as complementary data strobe signals). According to JP2008-112565A, even if the time required for the rising edge of the complementary data strobe signals is different from that required for the falling edge of the complementary data strobe signals, the period of the complementary data strobe signals (the time between cross points of the complementary data strobe signals) can be kept constant.

In general, such a semiconductor device as described in JP2008-112565A is designed such that the potentials of the cross points of the complementary data strobe signals are equal to the intermediate potential (for example, intermediate potential Vtt) of the maximum amplitude of the data strobe signals (for example, the amplitude between power supply potential VDD and ground potential VSS). This design is intended to allow the timing when the complementary data strobe signals cross each other to coincide with the timing when the logical level of the data signal is switched. The data-receiving semiconductor device can receive accurate data signals during a predetermined period by making the potentials of the cross points of the complementary data strobe signals equal to the intermediate potential Vtt.

However, in the actual semiconductor device, the potentials of the cross points of the complementary data strobe signals may deviate from the intermediate potential Vtt. The present inventor has clarified that in this case, the timing when the complementary data strobe signals cross each other may disadvantageously deviate from the timing when the logical level of the data signal is switched.

The deviation between the period of the complementary data strobe signals and the period of the data signal may disadvantageously lead to a reduced period available for data loading or to loading of erroneous data.

A possible method for adjusting the potentials of the cross points of the complementary data strobe signals is to adjust the drive capability of an output circuit for the data strobe signals and thus the slew rate of the complementary data strobe signals. However, a change in the slew rate of the complementary data strobe signals may degrade signal quality such as the result of a change in signal reflection.

SUMMARY

In one embodiment, there is provided a semiconductor device that includes a clock generation circuit, a clock division circuit, an adjustment information holding section, and a data strobe output circuit. The clock generation circuit generates a first internal clock signal based on an external clock signal. The clock division circuit generates a second internal clock signal and a third internal clock signal based on the first internal clock signal. The clock division circuit includes an edge adjustment circuit configured to adjust a timing of at least one of a rising edge and a falling edge of the third internal clock signal. The adjustment information holding section supplies an edge adjustment signal to the edge adjustment circuit. The data strobe output circuit receives the second and third internal clock signals to generate a first data strobe signal in accordance with the second internal clock signal, while generating a second data strobe signal with a phase different from that of the first data strobe signal, in accordance with the third internal clock signal. The edge adjustment circuit variably adjusts the timing of at least one of the rising edge and falling edge of the third internal clock signal in accordance with the edge adjustment signal.

The above and other objects, features, and advantages of the present invention will become apparent from the following description with reference to the accompanying drawings which illustrate an example of the present invention.

BRIEF DESCRIPTION OF THE DRAWINGS

The above feature and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A typical example of a technical concept for solving a problem will be illustrated below.

However, contents claimed by the present application are not limited to this technical concept but are of course as set forth in the accompanying claims.

Figure 1:
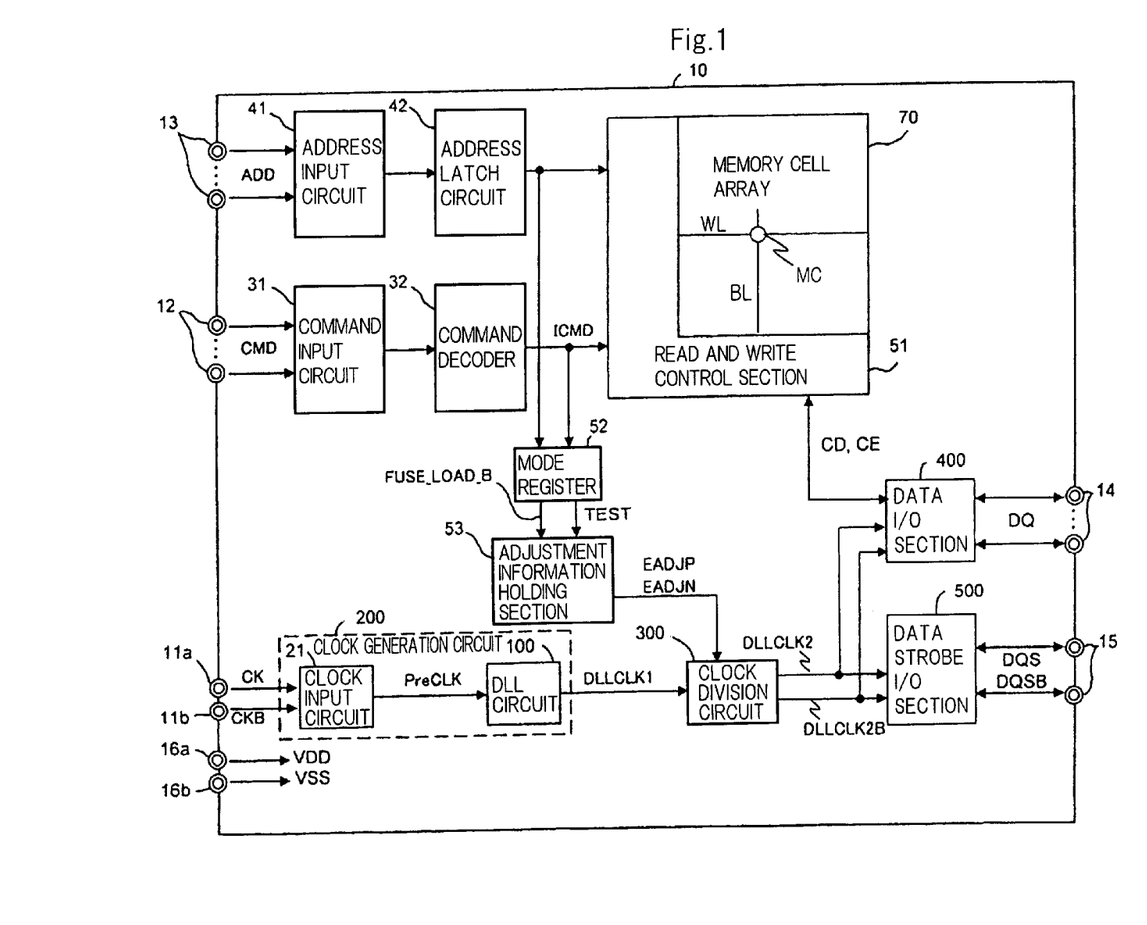
FIG. 1 is a block diagram showing the configuration of semiconductor device 10 according to a first embodiment of the present invention.

Referring now to FIG. 1, a semiconductor device 10 according to a first embodiment of the present invention is a DDR SDRAM including as external terminals, clock terminals 11a and 11b, command terminals 12, address terminals 13, data I/O terminals (data output terminals) 14, data strobe terminals 15, and power supply terminals 16a and 16b. Semiconductor device 10 also includes other terminals such as a reset terminal, which are not shown in the drawings.

Clock terminal 11a is supplied with external clock signal CK. Clock terminal 11b is supplied with external clock signal CKB. External clock signal CK supplied to clock terminal 11a and external clock signal CKB supplied to clock terminal 11b are fed to clock input circuit 21.

In the present specification, signals each with a signal name having the letter "B" added to the end thereof are inverting or low-active signals of the respective corresponding signals. Thus, external clock signal CK and external clock signal CKB are complementary to each other.

Clock input circuit 21 generates single-phase internal clock signal PreCLK based on external clock signals CK and CKB. Clock input circuit 21 then supplies internal clock signal PreCLK to DLL circuit 100.

DLL circuit 100 generates phase-controlled internal clock signal DLLCLK1 (first internal clock signal) based on internal clock signal PreCLK. DLL circuit 100 supplies internal clock signal DLLCLK1 to clock division section 300.

Clock input circuit 21 and DLL circuit 100 are included in clock generation circuit 200. Clock generation circuit 200 generates internal clock signal DLLCLK1 (first internal clock signal) based on external clock signals CK and CKB.

Clock division section 300 generates complementary internal clock signal DLLCLK2 (second internal clock signal) and DLLCLK2B (third internal clock signal) based on single-phase internal clock signal DLLCLK1; this will be described below in further detail. As described below, clock division section 300 includes a clock division circuit including an edge adjustment circuit (see FIG. 2). The clock division circuit generates complementary internal clock signal DLLCLK2 and DLLCLK2B based on internal clock signal DLLCLK1. The edge adjustment circuit adjusts a timing of at least one of the rising and falling edges of internal clock signal DLLCLK2B.

Command terminals 12 are supplied with row address strobe signal RASB, column address strobe signal CASB, write enable signal WEB, chip select signal CSB, and on die termination signal ODT. Furthermore, command terminal 12 accepts test commands. These command signals CMD are supplied to command input circuit 31. Command signals CMD input to command input circuit 31 are supplied to command decoder 32.

Command decoder 32 is a circuit configured to generate various internal commands ICMD by holding, decoding, and counting the command signals. Generated internal commands ICMD are supplied to read and write control section 51 and mode register 52. Upon receiving a test command, command decoder 32 supplies the test command to mode register 52.

Read and write control section 51 includes a column control circuit, a row control circuit, a column decoder, a row decoder, a sense circuit, a data amplifier, and an FIFO circuit. In read and write control section 51, internal command ICMD is supplied to the row control circuit and the column control circuit.

Address terminals 13 are supplied with address signals ADD. Address signals ADD supplied to address terminals 13 are fed to address input circuit 41. An output from address input circuit 41 is supplied to address latch circuit 42. Among address signals ADD latched by address latch circuit 42, row addresses are supplied to the row control circuit in read and write control section 51. Column addresses are supplied to the column control circuit in read and write control section 51. Furthermore, if semiconductor device 10 has been entered in a mode register set, address signals ADD will be supplied to mode register 52 to update the contents of mode register 52. Additionally, address terminals 13 are supplied with test codes. The test codes supplied to address terminals 13 are fed to mode register 52 via address input circuit 41 and address latch circuit 42.

Upon receiving an internal command (test command) indicative of a test operation from command decoder 32, mode register 52 supplies adjustment information holding section 53 with test code signals TEST at logical levels corresponding to the respective test codes input through address terminals 13. Furthermore, mode register 52 supplies fuse load signal FUSE_LOAD_B to adjustment information holding section 53 when semiconductor device 10 is initialized.

Adjustment information holding section 53 generates edge adjustment signals based on test code signals TEST. Adjustment information holding section 53 then supplies the edge adjustment signals to the edge adjustment circuit in clock division section 300.

The edge adjustment circuit in clock division section 300 variably adjusts the timing of the rising edge or the falling edge, or both the rising and falling edge of internal clock signal DLLCLK2B in accordance with the edge adjustment signals. Internal clock signals DLLCLK2 and DLLCLK2B are supplied to data I/O section 400 and data strobe I/O section 500.

Data I/O terminals 14 are terminals through which read data DQ is output and through which write data DQ is input. Data I/O terminals 14 are connected to data I/O section 400. Data I/O section 400 is supplied with complementary internal clock signals DLLCLK2 and DLLCK2B generated by clock division section 300. Data I/O section 400 provides a burst output of read data DQ in synchronism with internal clock signals DLLCLK2 and DLLCK2B during a read operation.

The number of data I/O terminals 14 can be appropriately changed. For example, in a specific example described below (see FIG. 3), the number of data I/O terminals 14 is 8 as illustrated in FIG. 3. As described below, if a plurality of data I/O terminals 14 are provided, then the number of clock division circuits (see FIG. 2) in clock division section 300, the number of data output circuits (see FIG. 3) in data I/O section 400, and the number of data input circuits in data I/O section 400 need to be the same as that of data I/O terminals 14.

Data strobe I/O section 500 receives internal clock signals DLLCLK2 and DLLCLK2B. Data strobe I/O section 500 includes a data input circuit and a data output circuit as described below.

Data strobe output circuit receives internal clock signals DLLCLK2 and DLLCLK2B to generate first data strobe signal DQS in accordance with internal clock signal DLLCLK2, while generating second data strobe signal DQSB with a phase different from that of first data strobe signal DQS, in accordance with internal clock signal DLLCLK2B. First data strobe signal DQS and second data strobe DQSB are output through data strobe terminals 15.

Read and write control section 51 reads data from memory cell 70 and write data to memory cell 70 based on address signal ADD from address latch circuit 42, internal command ICMD from command decoder 32, and a signal from data I/O section 400.

For example, an output from a row control circuit in read and write control section 51 is supplied to a row decoder in read and write control section 51. The row decoder is a circuit configured to select any of word lines WL contained in memory cell array 70. In memory cell array 70, a plurality of word lines WL cross a plurality of bit lines BL, and memory cells MC are arranged at intersections between word lines WL and bit lines BL (FIG. 1 shows only one word line WL, one bit line BL, and one memory cell MC). Bit line BL is connected to corresponding sense amplifier SA in the sense circuit in read and write control circuit 51.

Furthermore, an output from the column control circuit in read and write control section 51 is supplied to the column decoder in read and write control section 51. The column decoder is a circuit configured to select any of sense amplifiers SA contained in the sense circuit in read and write control section 51. Sense amplifier SA selected by the column decoder is connected to the data amplifier in read and write control section 51.

During a read operation, the data amplifier further amplifies read data amplified by the sense amplifier SA. The data amplifier then supplies the resultant read data to a FIFO circuit in read and write control section 51 via read write bus RWBS. On the other hand, during a write operation, the data amplifier amplifies the write data supplied by the FIFO circuit via read write bus RWBS, and feeds the amplified write data to sense amplifier SA. The FIFO circuit is connected to data I/O section 400.

Power supply terminals 16a and 16b are supplied with external power supply potential VDD and ground potential VSS. In the present specification, the voltage between external power supply potential VDD and ground potential VSS is sometimes referred to simply as "external voltage VDD".

Each of the circuits shown in FIG. 1 is supplied with external voltage VDD and operates using external voltage VDD as a power source. Thus, the voltage of signals handled by each of the circuits shown in FIG. 1 has the same amplitude value as that of external voltage VDD. For example, internal clock DLLCLK1 vibrates between external power supply potential VDD and ground potential VSS. Memory cell array 70 also uses an array voltage (VARAY), a high voltage (VPP) higher than the external voltage VDD, and even a negative voltage (VBB). However, these voltages do not relate directly to the spirit of the present invention and will thus not be described. Alternatively, semiconductor device 10 may internally generate internal voltage VPERI according to an external voltage VDD so that each circuit shown in FIG. 1 can at least partly be configured to operate in response to internal voltage VPERI.

Figure 2:
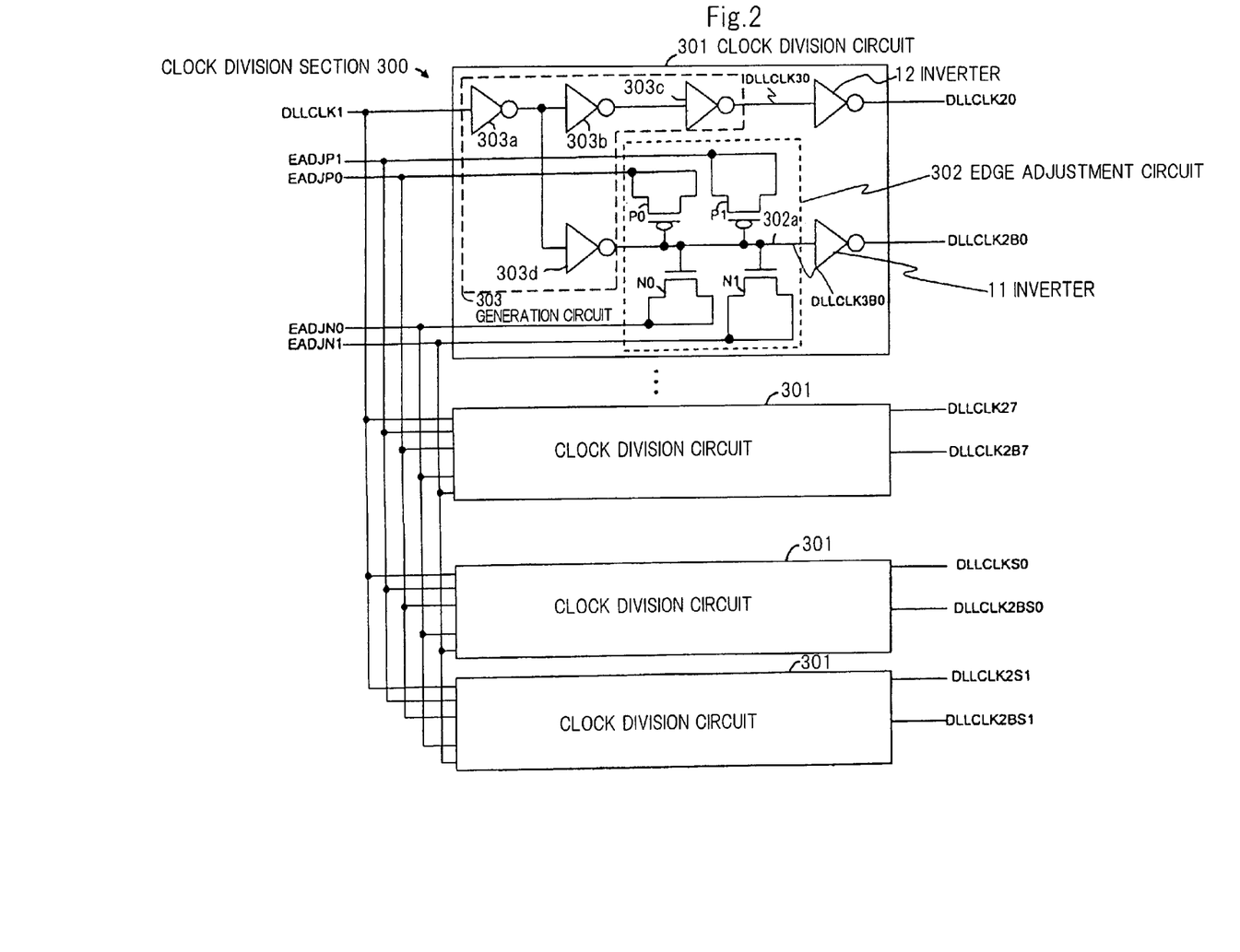
FIG. 2 is a circuit diagram of clock division section 300.
Figure 3:
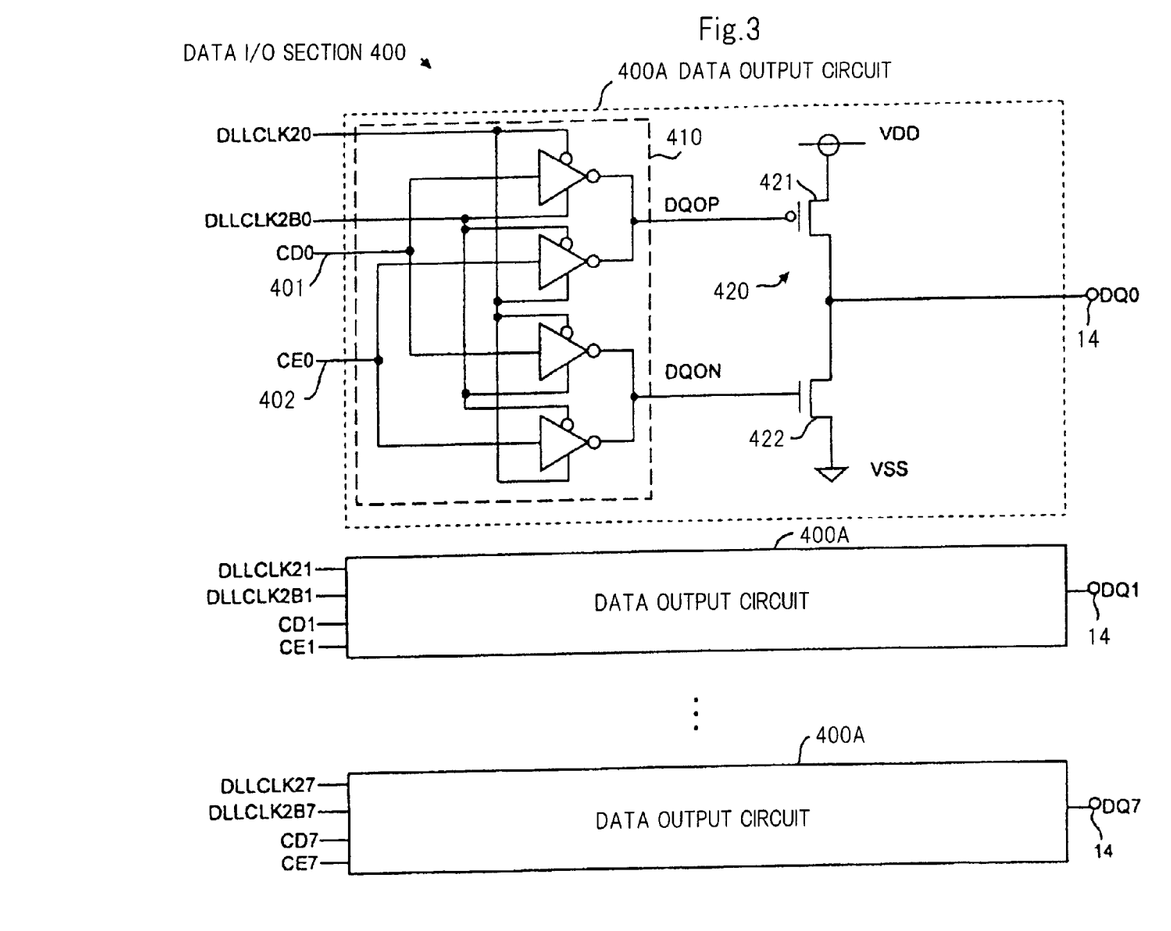
FIG. 3 is a circuit diagram of data I/O section 400.

FIG. 2 is a circuit diagram of clock division section 300.

As shown in FIG. 2, clock division section 300 includes a plurality of clock division circuits 301. Each of the plurality of clock division circuits 301 supplies internal clock signal DLLCLK2$n$ ($n$=0 to 7, S0, S1) (second internal clock signal) and internal clock signal DLLCLK2B$n$ ($n$=0 to 7, S0, S1) (third internal clock signal) to one from among a plurality of data output circuits (described below) and one from among a plurality of data strobe output circuits (described below) both of which correspond to clock division circuit 301. The internal clock signal DLLCLK2$n$ and internal clock signal DLLCLK2B$n$ corresponding to each other are complementary to each other.

Each clock division circuit 301 includes edge adjustment circuit 302, generation circuit 303, and inverters 11 (second driver circuit) and 12 (first driver circuit). Generation circuit 303 includes inverters 303a to 303d.

Generation circuit 303 generates complementary internal cock signals DLLCLK30 and DLLCLK3B0 (a fourth internal clock signal and a fifth internal clock signal which have different phases) based on internal clock signals DLLCLK1.

Edge adjustment circuit 302 variably adjusts at least one of the rise time and fall time of one of complementary internal clock signal DLLCLK30 and DLLCLK3B0 (in the present embodiment, internal clock signal DLLCLK3B0) in accordance with the edge adjustment signals supplied by adjustment information holding section 53 shown in FIG. 1.

Edge adjustment circuit 302 includes path (signal line) 302a used to generate internal clock signal DLLCLK2B$n$ ($n$=0 to 7, S0, S1), MOS capacitances P0 and P1 (capacitive elements) of a P type that is one of two conductivity types, and MOS capacitances N0 and N1 (capacitive elements) of an N type that is the other conductivity type. Edge adjustment circuit 302 operates in accordance with the edge adjustment signals supplied by adjustment information holding section 53 shown in FIG. 1.

Each of MOS capacitances P0 and P1 and MOS capacitances N0 and N1 is connected to path 302a at one end thereof (gate; control electrode) and supplied to the edge adjustment signal through the other end (source and drain; the first and second electrodes).

MOS capacitances P0 and P1 are activated (function as capacitances) when edge adjustment signals EADJP0 and EADJP1, respectively, are set to an H (High) level, one of two logical levels, and are inactivated (fail to function as capacitances) when adjustment signals EADJP0 and EADJP1, respectively, are set to an L (Low) level, the other logical level.

MOS capacitances N0 and N1 are inactivated (fail to function as capacitances) when edge adjustment signals EADJN0 and EADJN1, respectively, are set to the H (High) level, one of the two logical levels, and are activated (function as capacitances) when edge adjustment signals EADJN0 and EADJN1, respectively, are set to the L (Low) level, the other logical level.

Upon being activated (function as capacitance), MOS capacitances P0 and P1 change the slew rate of the falling edge (Fall) of internal clock signal DLLCLK3B, a first edge, but fail to act on (fail to change the slew rate of) the rising edge of internal clock signal DLLCLK3B, a second edge.

On the other hand, upon being activated, MOS capacitances N0 and N1 change the slew rate of the rising edge of internal clock signal DLLCLK3B, the second edge, but fail to act on (fail to change the slew rate of) the falling edge of internal clock signal DLLCLK3B, the first edge.

This is because the dependence of the MOS capacitances on the gate voltage varies with the conductivity type of the substrate.

Thus, edge adjustment circuit 302 variably adjusts the rise time and fall time of internal clock signal DLLCLK30 or DLLCLK3B0 (in the present embodiment, internal clock signal DLLCLK3B0) depending on the voltage supplied to the other end of each of MOS capacitances P0, P1, N0, and N1 (depending on whether the voltage is at the H level or at the L level).

Edge adjustment circuit 302 may variably adjust the rise time or fall time of internal clock signal DLLCLK30 instead of internal clock signal DLLCLK3B0. In this case, edge adjustment circuit 302 is provided in the stage before inverter I2 rather than in the stage inverter I1.

Inverter I1 (second driver circuit) to which internal clock signal DLLCLK3B is input has a high driving capability sufficient to prevent a possible change in the slew rate of internal clock signal DLLCLK2B, which is an output from inverter I1, even when the slew rate of internal clock signal DLLCLK3B changes. Thus, when the slew rate of internal clock signal DLLCLK3B is changed, the timing of the rising or falling edge of internal clock signal DLLCLK2B can be changed without any change in the slew rate of internal clock signal DLLCLK2B.

In clock division circuit 301, the size of each of inverters 303a to 303d, I1, and I2 is designed such that with MOS capacitances P0 and N0 activated, internal clock signal DLLCLK2 will have substantially the same delay time as that of internal clock signal DLLCLK2B, though this is not particularly limited.

With this design, the timing of the rising or falling edge of internal clock signal DLLCLK2B may be made faster by inactivating the corresponding one of MOS capacitances P0 and N0 to increase the slew rate of the rising or falling edge of internal clock signal DLLCLK3B. In contrast, the timing of the rising or falling edge of internal clock signal DLLCLK2B may be adjusted later by activating the corresponding one of MOS capacitances P1 and N1 to reduce the slew rate of the rising or falling edge of internal clock signal DLLCLK3B.

FIG. 3 is a circuit diagram of data I/O section 400. Data I/O section 400 includes a data output circuit and a data input circuit. FIG. 3 shows only data output circuit 400A. This is because the data input circuit does not relate directly to the present invention.

As shown in FIG. 3, data output circuit 400A includes multiplexer 410 configured to receive internal data signals CD and CE supplied via data lines 401 and 402, respectively, and output buffer 420 configured to receive signals DQ0P and DQ0N that are outputs from multiplexer 410 and to output read data (external data signals) DQ0 through data I/O terminal 14.

Multiplexer 410 is a clocked driver configured to output an inverted signal of internal data signal CD supplied via data line 401, in synchronism with the rising edge of internal clock signal DLLCLK2. Multiplexer 410 further outputs an inverted signal of internal data signal CE supplied via data line 402, in synchronism with the rising edge of internal clock signal DLLCLK2B.

Signals DQ0P and DQ0N that are outputs from multiplexer 410 are supplied to the gate electrodes of P-channel MOS transistor 421 (output transistor) and N-channel MOS transistor 422 (output transistor) both included in output buffer 420. Thus, at the rising edge of internal clock signal DLLCLK2, one transistor from among transistors 421 and 422 is turned on based on the logical level of the inverted signal of internal data signal CD. Transistor 421 or 422 thus outputs external data signal DQ at the high or low level. Similarly, at the rising edge of internal clock signal DLLCLK2B, one transistor from among transistors 421 and 422 is turned on based on the logical level of the inverted signal of internal data signal CE. Transistor 421 or 422 thus outputs external data signal DQ at the high or low level. Thus, external data signal DQ0 is continuously output through the data I/O terminal 14.

In FIG. 3, 8 data I/O terminals 14 are provided by way of example. That is, in the present example, 8-bit read data DQ0 to DQ7 are output in parallel. As shown in FIG. 3, if 8 data I/O terminals 14 are provided, the numbers of provided clock division circuits 301 and data output circuits 400A are also 8 each.

Figure 4:
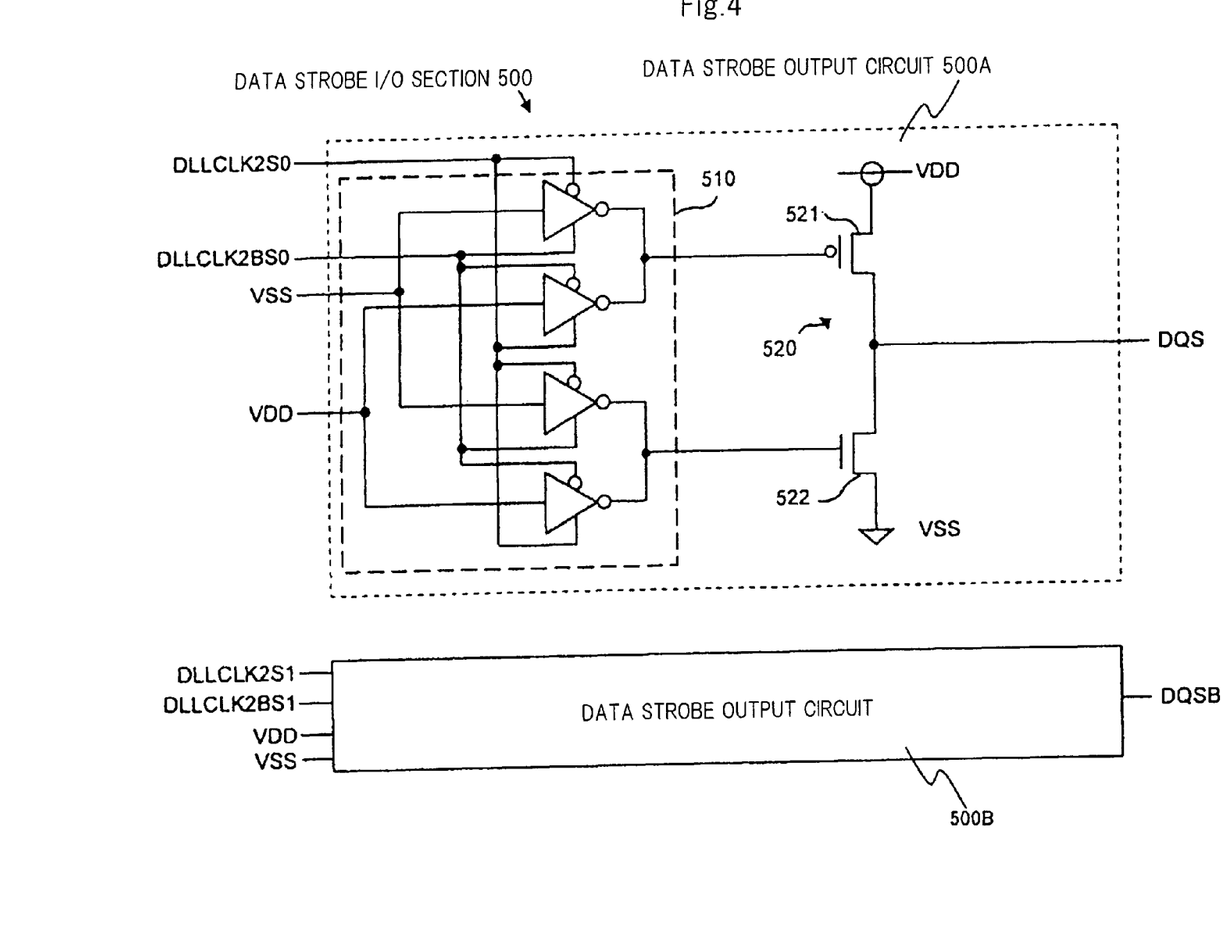
FIG. 4 is a circuit diagram of data strobe I/O section 500.

FIG. 4 is a circuit diagram of data strobe I/O section 500. Data strobe I/O section 500 includes data strobe output circuits and data strobe input circuits. However, FIG. 4 shows only data strobe output circuits 500A and 500B. This is because the data strobe input circuits do not relate directly to the present invention.

Each of data strobe output circuits 500A and 500B includes multiplexer 510 and output buffer 520. Data strobe output circuit 500A is different from data input circuit 400A shown in FIG. 3 in that signals corresponding to data signals CD and CE are fixed to the power supply potentials (VDD and VSS). Specifically, in data strobe output circuit 500A configured to generate normal-phase data strobe signal DQS, a signal corresponding to data signal CD is fixed to VSS, whereas a signal corresponding to data signal CE is fixed to VDD. In contrast, in data strobe output circuit 500B configured to generate reversed-phase data strobe signal DQSB, a signal corresponding to data signal CD is fixed to VDD, whereas a signal corresponding to data signal CE is fixed to VSS.

Data strobe output circuit 500A converts normal-phase data strobe signal DQS from the L level, a first level, to the H level, a second level, in response to the rising edge of the internal clock signal DLLCLK2. Data strobe output circuit 500A converts normal-phase data strobe signal DQS from the H level, the second level, to the L level, the first level, in response to the falling edge of the internal clock signal DLLCLK2. That is, internal clock signal DLLCLK2B is prevented from affecting the conversion in normal-phase data strobe signal DQS.

Data strobe output circuit 500B converts reversed-phase data strobe signal DQSB from the L level, the first level, to the H level, the second level, in response to the rising edge of the internal clock signal DLLCLK2B. Data strobe output circuit 500B changes reversed-phase data strobe signal DQSB from the H level, the second level, to the L level, the first level, in response to the rising edge of the internal clock signal DLLCLK2B. That is, internal clock signal DLLCLK2 is prevented from affecting the conversion in reversed-phase data strobe signal DQSB.

Figure 5:
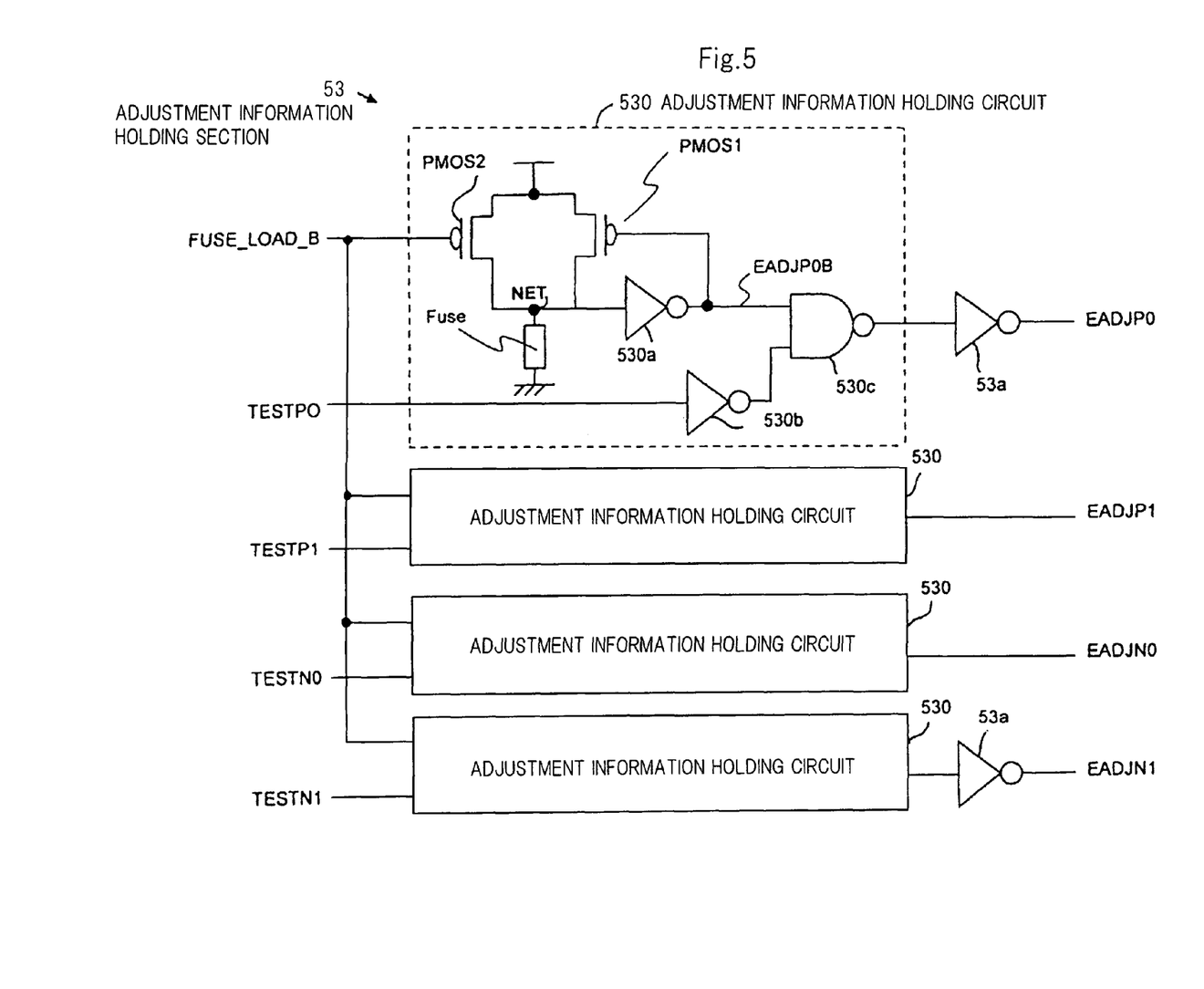
FIG. 5 is a circuit diagram of adjustment information holding section 53.

FIG. 5 is a circuit diagram of adjustment information holding section 53. Adjustment information holding section 53 includes a plurality of adjustment information holding circuits 530. Each of adjustment information holding circuits 530 includes PMOS transistors PMOS1 and PMOS2, fuse element Fuse, inverters 530a and 530b, and NAND gate 530c. Here, the plurality of adjustment information holding circuits 530 have the same configuration except that adjustment information holding circuits 530 are supplied with different test code signals TESTP0, TESTP1, TETN0, and TESTN1.

Fuse element Fuse is a laser fused formed of aluminum or the like and which can be cut by irradiation with laser. Instead of the fuse that is cut by laser, an electrically destructible antifuse may be used as the fuse element Fuse. If the fuse element is not cut, node NET is short-circuited to ground potential VSS. If the fuse element is cut, node NET is disconnected from ground potential VSS (prevented from being short-circuited to ground potential VSS).

Fuse load signal FUSE_LOAD_B is a signal supplied to all of the plurality of adjustment information holding circuits 530 by mode register 52 shown in FIG. 1. Fuse load signal FUSE_LOAD_B is at the L level, corresponding to an active state, for a predetermined short time during initialization of semiconductor device 10, thus supplying a charge to node NET for a very short time.

Test code signals TESTP0, TESTP1, TESTN0, and TESTN1 are supplied to the respective corresponding adjustment information holding circuits by mode register 52 shown in FIG. 1.

If semiconductor device 10 is in a test operation mode, mode register 52 sets each of a plurality of test code signals TESTP0, TESTP1, TESTN0, and TESTN1 to either the active level H and the inactive level L. Furthermore, if semiconductor device 10 is in a normal operation mode, mode register 52 sets each of the plurality of test code signals TESTP0, TESTP1, TESTN0, and TESTN1 to the inactive, L level.

Now, operations of adjustment information holding circuit 530 performed when fuse element Fuse is not cut and when the fuse element Fuse is cut will be described taking, by way of example, adjustment information holding circuit 530 to which test code signal TEST P0 is supplied.

If fuse element Fuse is not cut, the charge provided by fuse load signal FUSE_LOAD_B flows to VSS. Thus, EADJP0B is set to the H level. Hence, when test code signal TESTP0 is at the L level (normal operation mode), EADJP0 is at the H level.

If fuse element Fuse is cut, the charge provided by fuse load signal FUSE_LOAD_B is prevented from flowing to VSS. Thus, EADJP0B is set to the L level, and PMOS transistor PMOS1 to which current has been fed back fixes node NET to the H level. Hence, in this case, EADJP is set to the L level without depending on test code signal TETSP0.

In FIG. 5, if fuse element Fuse in each adjustment information holding circuit 530 is not cut and each test code signal P0 is in an inactive state, edge adjustment signals EADJP0 and EADJN1 are at the H level, whereas edge adjustment signals EADJP1 and EADJP0 are at the L level (initial state). Thus, in this configuration, in the initial state, MOS capacitances P0 and N0 of edge adjustment circuit 302 are in an active state.

Furthermore, if fuse element Fuse in each adjustment information holding circuit 530 is cut or if each test code signal P0 is in the active state, edge adjustment signals EADJP0 and EADJN1 will be at the L level, whereas edge adjustment signals EADJP1 and EADJP0 will be at the H level.

As described above, adjustment information holding circuit 530 can variably switch the MOS capacitances of edge adjustment circuit 302 between the active state and the inactive state depending on the state of fuse element Fuse in which fuse element Fuse is cut or is not cut or the active/inactive state of the test code signal.

As described above, semiconductor device 10 according to the present embodiment includes clock generation circuit 200 configured to generate a first internal clock signal based on the external clock signal, clock division circuit 301 configured to generate a second internal clock signal and a third internal clock signal based on the first internal clock signal and including edge adjustment circuit 302 that adjusts the timing of at least one of the rising and falling edges of the third internal clock signal, adjustment information holding section 53 configured to supply the edge adjustment signals to edge adjustment circuit 302, and data strobe output circuit 500 configured to receive the second and third internal clock signals and to generate a first data strobe signal in accordance with the second internal clock signal, while generating a second data strobe signal having a phase different from that of the first data strobe signal, in accordance with the third internal clock signal. Edge adjustment circuit 302 variably adjusts the timing of at least one of the rising and falling edges of the third internal clock signal in accordance with the edge adjustment signals.

Furthermore, in the present embodiment, clock division circuit 301 generates the second internal clock signal by delaying the first internal clock signal by substantially a given delay time.

Additionally, in the present embodiment, clock division circuit 301 further includes generation circuit 303 configured to generate a fourth internal clock signal and a fifth internal clock signal which have different phases, based on the first internal clock signal. Edge adjustment circuit 302 variably adjusts at least one of the rise time and fall time of the fifth internal clock signal in accordance with the edge adjustment signal.

In addition, in the present embodiment, clock division circuit 301 further includes first driver circuit I2 configured to receive the fourth internal clock signal and to generate and supply the second internal clock signal to data strobe output circuit 500, and second driver circuit I1 configured to receive the fifth internal clock signal and to generate and supply the third internal clock signal to the data strobe output circuit. Edge adjustment circuit 302 is arranged between generation circuit 303 and second driver circuit I1.

Furthermore, in the present embodiment, second driver circuit I1 makes the rise time and fall time of the third clock signal constant even when at least one of the rise time and fall time of the fifth internal clock signal changes.

Additionally, in the present embodiment, edge adjustment circuit 302 includes signal line 302a through which the fifth internal clock signal propagates and capacitive elements P0, P1, N1, and N1 connected to signal line 302a at one end thereof and supplied with the edge adjustment signals through the other end thereof.

In addition, in the present embodiment, each of capacitive elements P0, P1, N0, and N1 has a capacitance value varying depending on the potential supplied to the one end thereof.

Furthermore, in the present embodiment, each of capacitive elements P0, P1, N0, and N1 includes a control electrode forming one end thereof and connected to signal line 302a and a transistor forming the other end thereof and including a first electrode and a second electrode to both of which the edge adjustment signal is supplied.

Now, a method for adjusting the potentials of the cross points of the complementary data strobe signals will be described.

A. A test command is input through command terminal 12 to set semiconductor device 10 to the test mode. The potentials of the cross points of the complementary data strobe signals (normal-phase data strobe signal DQS and reversed-phase data strobe signal DQSB) are measured by an external test device or the like.

B. If the potentials of the cross points of the complementary data strobe signals deviate from intermediate potential Vtt of the maximum amplitude of the data strobe signal and need to be adjusted, a predetermined test code will be input via address terminal 13. Thus, semiconductor device 10 performs the following test adjustment operation.

The predetermined test code is supplied to mode register 52. Mode register 52 sets each of test code signals TETP0, TESTP1, TESTN0, and TEST N1 to the logical levels (selection of the active state/inactive state) corresponding to the predetermined test codes, and then supplies the resultant test code signals to adjustment information holding section 53.

Upon receiving the test code signals, adjustment information holding section 53 sets edge adjustment signals EADJP and EADJN to the logical levels corresponding to the logical levels of the test code signals. Adjustment information holding section 53 then supplies the resultant edge adjustment signals EADJP and EADJN to clock division section 300.

Upon receiving edge adjustment signals EADJP and EADJN, edge adjustment circuit 302 in each of clock division circuits 301 in clock division section 300 switches the MOS capacitances P0, P1, N0, and N1 between the active state and the inactive state in association with the logical levels of edge adjustment signals EADJP and EADJN.

When MOS capacitances P0, P1, N0, and N1 are switched between the active state and the inactive state, a change occurs in the slew rate of the timing of the rising edge or the falling edge of the internal clock signal DLLCLK3B which corresponds to MOS capacitances P0 and P1 with the state thereof switched or MOS capacitances N0 and N1 with the state thereof switched (for example, this corresponds to the falling edge if the state of MOS capacitances P0 and P1 changes or to the rising edge if the state of MOS capacitances N0 and N1 changes). In response, a change occurs in the timing of the rising edge or the falling edge of the internal clock signal DLLCLK2B which timing corresponds to the edge of internal clock signal DLLCLK3B with the slew rate thereof changed. At this time, the slew rate of the rising and falling edges of internal clock signal DLLCLK2B is unchanged.

When the timing of the rising and falling edges of internal clock signal DLLCLK2B changes, a change occurs in the timing of the rising edge or the falling edge of reversed-phase data strobe signal DQSB which timing corresponds to a changed the timing of the rising edge or the falling edge of internal clock signal DLLCLK2B. Thus, the cross points of the complementary data strobe signals change. Then, the test adjustment operation is completed.

C. The potentials of the cross points of the complementary data strobe signals are measured again. If the potentials of the cross points of the complementary data strobe signals deviate from intermediate potential Vtt, the operation in B. described above is repeated with the test code changed. The operation is repeated until the potentials of the cross points of the complementary data strobe signals substantially equal intermediate potential Vtt.

D. If the potentials of the cross points of the complementary data strobe signals substantially equal intermediate potential Vtt, specifically, if the differences between the intermediate potential Vtt and the potentials of the cross points fall within a predetermined range, fuse element Fuse in adjustment information holding section 53 will be cut. Specifically, fuse element Fuse, which is provided in adjustment information holding circuit 530, which is supplied with the test code signal in the active state, is cut. On the other hand, fuse element Fuse is not cut which is provided in adjustment information holding circuit 530 being supplied with the test code signal in the inactive state.

Figure 6:
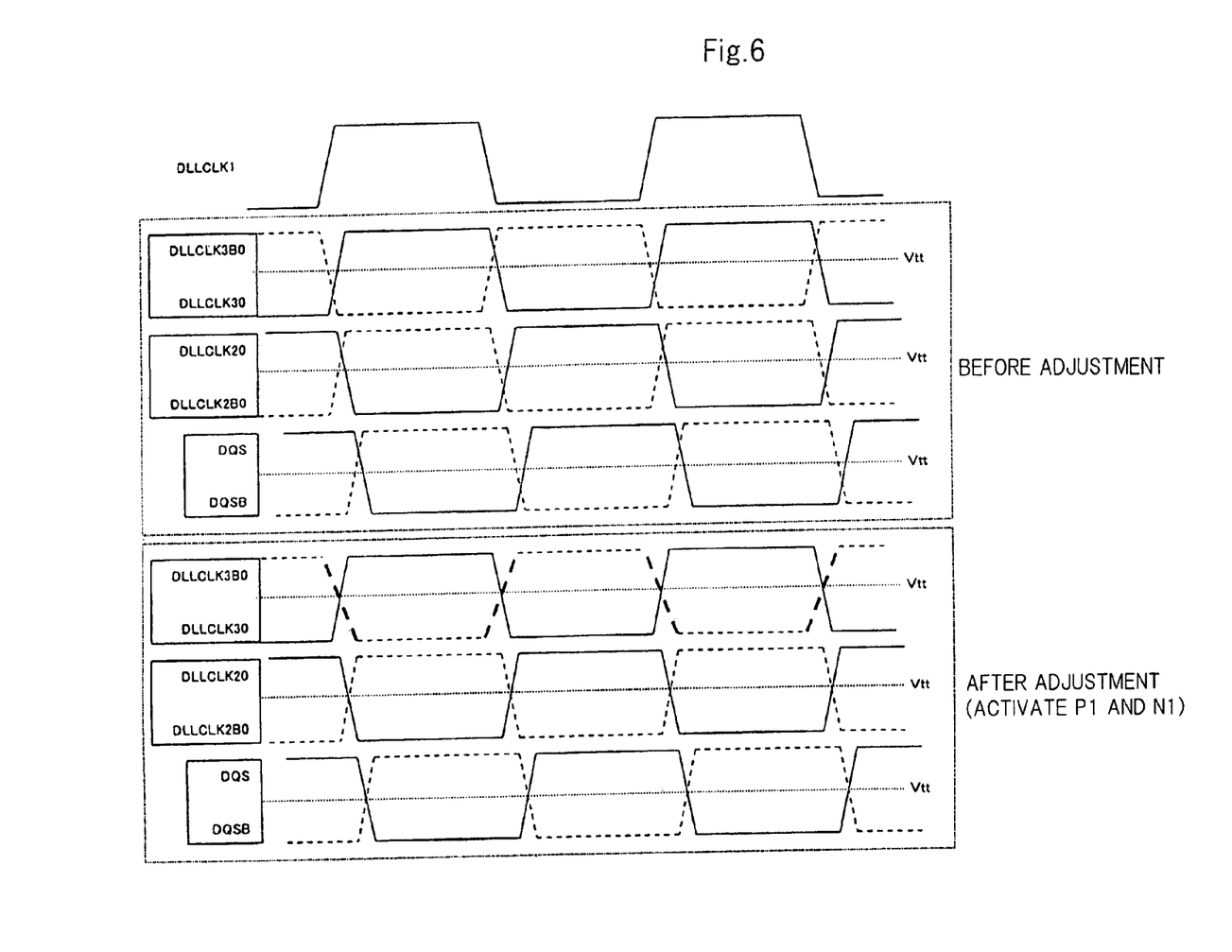
FIG. 6 is a diagram illustrating an example of an internal clock signal, a first data strobe signal, and a second data strobe signal.

FIG. 6 illustrates waveforms obtained when the potentials of the cross points of internal clock signals DLLCLK2B0 and DLLCLK20 from clock division circuit 301 shown in FIG. 2 deviate from the intermediate potential Vtt, causing the potentials of the cross points of first data strobe signal DQS and second data strobe signal DQSB to deviate from intermediate voltage Vtt.

A variation in the slew rate of internal clock signal DLLCLK3B0 only changes only the slew rate of internal clock signal DLLCLK3B0 with the starting point of internal clock signal DLLCLK3B0 unchanged. This delays internal clock signal DLLCLK2B0, which succeeds internal clock signal DLLCLK3B0, to allow the potential of the cross points of internal clock signal DLLCLK2B0 and internal clock signal DLLCLK20 to be adjusted to intermediate voltage Vtt. Hence, with the potentials of the cross points of internal clock signal DLLCLK2B0 and internal clock signal DLLCLK20 adjusted, first data strobe signal DQS and second data strobe signal DQSB can be adjusted.

Figure 7:
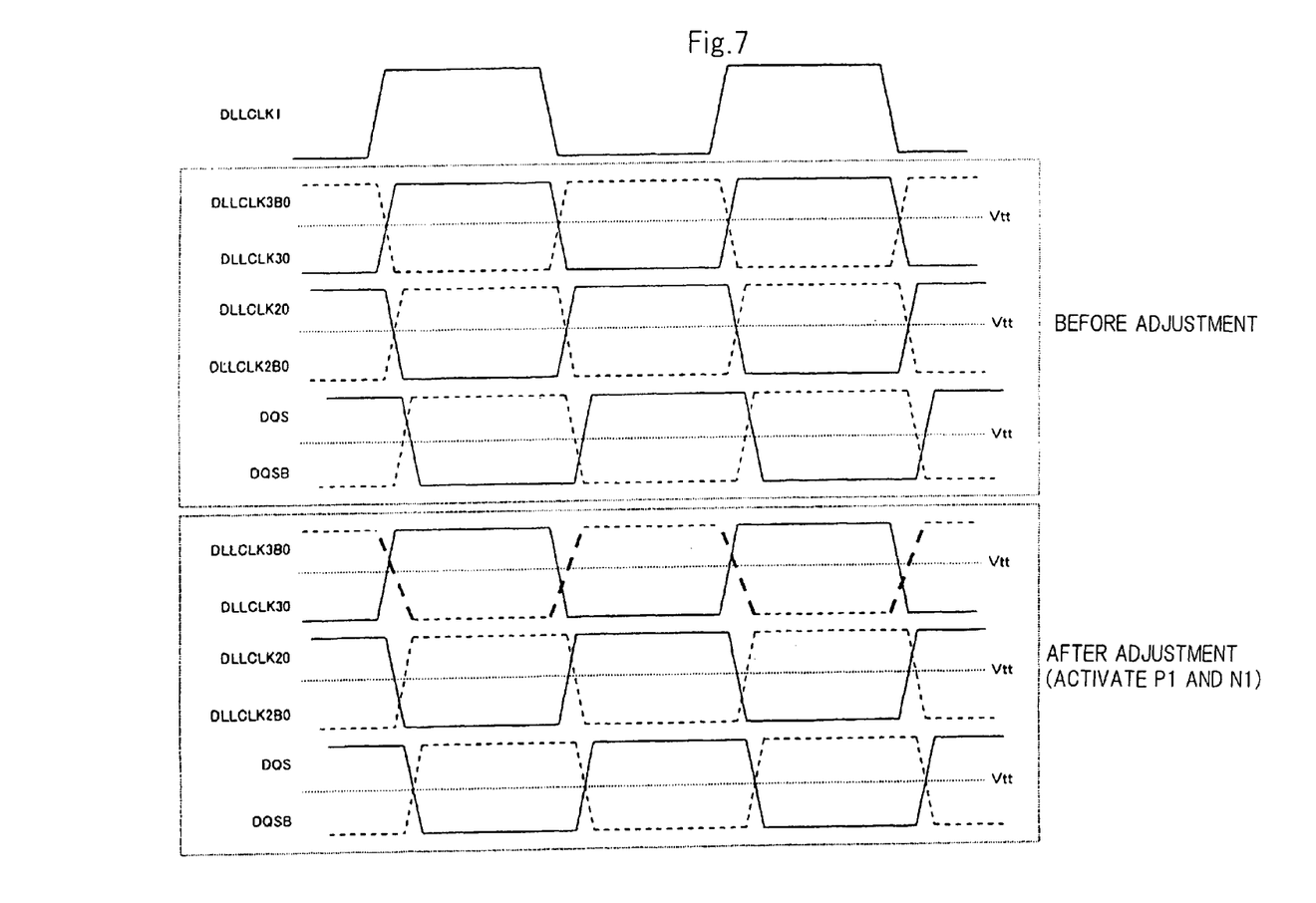
FIG. 7 is a diagram illustrating another example of the internal clock signal, first data strobe signal, and second data strobe signal.

On the other hand, FIG. 7 shows waveforms obtained when the potentials of the cross points of internal clock signals DLLCLK2B0 and DLLCLK20 from clock division circuit 301 shown in FIG. 2 match intermediate voltage Vtt but when in data strobe output circuits 500A and 500B, the potentials of the cross points of first data strobe signal DQS and second data strobe signal DQSB deviate from intermediate signal Vtt. In this case, the outputs of internal clock signals DLLCLK2B0 and DLLCLK20 from clock division circuit 301 shown in FIG. 2 are intentionally allowed to deviate from each other to adjust the potentials of the cross points of first data strobe signal DQS and second data strobe signal DQSB.

The characteristics of internal clock signal DLLCLK, first data strobe signal DQS, and second data strobe signal DQSB are reasonably designed so as to completely match one another. However, designing the characteristics so as to avoid errors of even several tens of mV level is difficult, and in actuality, errors need to be corrected. The present embodiment enables errors in internal clock signal DLLCLK, first data strobe signal DQS, and second data strobe signal DQSB to be corrected at one location.

Figure 8:
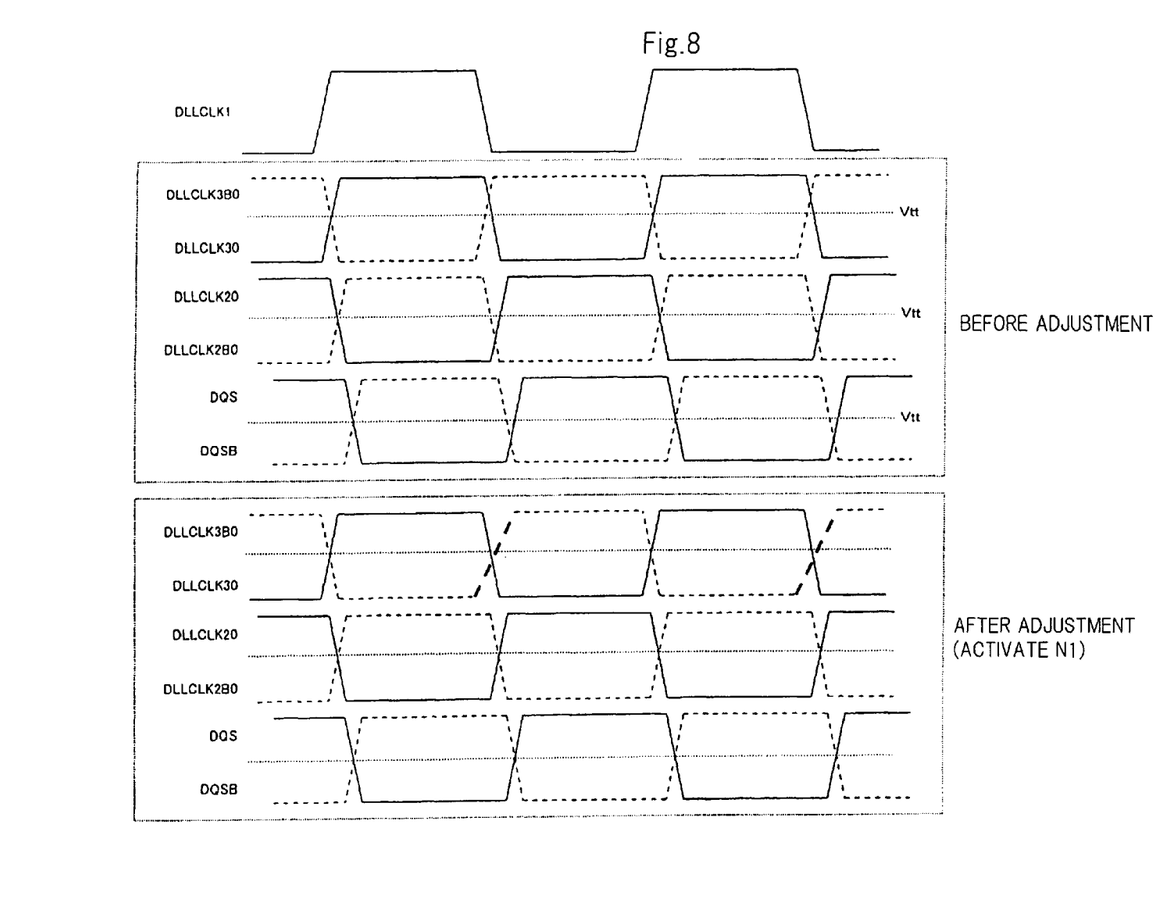
FIG. 8 is a diagram illustrating yet another example of the internal clock signal, first data strobe signal, and second data strobe signal.

FIG. 8 is a diagram illustrating waveforms obtained when in clock division circuit 301 shown in FIG. 2, the potentials of the cross points of internal clock signal DLLCLK2B0 and internal clock signal DLLCLK20 deviate from intermediate potential Vtt on only one side of the waveform.

Since only the N-type MOS capacitances adjust the rising edge of internal clock signal DLLCLK3B0, the slew rate of the signal is affected when the signal changes from the L level to the H level. Hence, only the rising edge of internal clock signal DLLCLK3B0 is delayed, resulting in a variation in the duty (ratio of the H width to the L width) of internal clock signal DLLCLK2B0. As a result, the potentials of the cross points of first data strobe signal DQS and second data strobe signal DQSB can be adjusted.

According to the present embodiment, edge adjustment circuit 302 variably adjusts the timing of at least one of the rising and falling edges of the third internal clock signal in accordance with the edge adjustment signal. Data strobe I/O section 500 generates a first data strobe signal in accordance with the second internal clock signal, and generates a second data strobe signal in accordance with the third internal clock signal. Thus, the potentials of the cross points of the first and second data strobe signals can be adjusted without the need to change the drive capability of data strobe I/O section 500, that is, without the need to change the slew rates of the first and second data strobe signals.

Furthermore, in the present embodiment, clock division circuit 301 generates the second internal clock signal by delaying the first internal clock signal by substantially a given delay time. Clock division circuit 301 further includes generation circuit 303 configured to generate a fourth internal clock signal and a fifth internal clock signal which have different phases, based on the first internal clock signal. Edge adjustment circuit 302 variably adjusts at least one of the rise time and fall time of the fifth internal clock signal in accordance with the edge adjustment signal. Clock division circuit 301 further includes first driver circuit I2 configured to receive the fourth internal clock signal and to generate and supply a second internal clock signal to data strobe output circuit 500, and second driver circuit I1 configured to receive the fifth internal clock signal and to generate and supply a third internal clock signal to the data strobe output circuit. Edge adjustment circuit 302 is arranged between generation circuit 303 and second driver circuit I1. Second driver circuit I1 keeps the rise time and fall time of the third clock signal constant even when at least one of the rise time and fall time of the fifth internal clock signal changes.

According to the present embodiment, the timing of at least one of the rising and falling edges of the third internal clock signal can be variably adjusted by variably adjusting at least one of the rise time and fall time of the fifth internal clock signal.

Furthermore, in the present embodiment, edge adjustment circuit 302 includes signal line 302a through which the fifth internal clock signal propagates and capacitive elements P0, P1, N1, and N1 connected to signal line 302a at one end thereof and supplied with the edge adjustment signals through the other end thereof. Each of capacitive elements P0, P1, N0, and N1 has a capacitance value varying depending on a potential supplied to the one end thereof. Each of capacitive elements P0, P1, N0, and N1 includes the control electrode forming the one end thereof and connected to signal line 302a and the transistor forming the other end thereof and including the first electrode and the second electrode to both of which the edge adjustment signal is supplied.

According to the present embodiment, the timing of at least one of the rising and falling edges of the third internal clock signal can be variably adjusted by controlling the voltage supplied to each of the capacitive elements P0, P1, N0, and N1.

In the above-described embodiment, edge adjustment signals EADJP and EADJN are supplied to each of the plurality of clock division circuits 301 in clock division section 300. This configuration is useful because it enables a reduction in the area of adjustment information holding circuit 530 and in the number of wires for the edge adjustment signals if the deviation, from the intermediate potential Vtt, of the potentials of the cross points of the complementary data strobe signals is caused by, for example, possible noise generated before internal clock signals DLLCLK2 and DLLCLK2B are supplied to data output circuit 400A and data strobe I/O section 500.

On the other hand, if the deviation, from the intermediate potential Vtt, of the potentials of the cross points of the complementary data strobe signals is caused by, for example, possible noise generated after internal clock signals DLLCLK2 and DLLCLK2B have been supplied to data output circuit 400A and data strobe I/O section 500, internal clock signal DLLCLK2B supplied to data output circuit 400A and internal clock signal DLLCLK2B supplied to data strobe I/O section 500 may be individually adjusted in some cases.

Specifically, such cases include the case where internal clock signal DLLCLK2B supplied to data output circuit 400A and internal clock signal DLLCLK2B supplied to data strobe I/O section 500 are individually adjusted when the timing of data outputs from data output circuit 400A is as designed, whereas the potentials of the cross points of the complementary data strobe signals deviate from intermediate potential Vtt.

In this case, clock division circuit 301 may include clock division circuit 301 configured to supply the internal clock signal to data output circuit 400A and clock division circuit 301 configured to supply the internal clock signal to data strobe I/O section 500 so that the edge adjustment signals can be individually supplied to two clock division circuits 301. In this case, adjustment information holding section 53 includes adjustment information holding circuit 530 for the data output circuit and adjustment information holding circuit 530 for data strobe I/O section 500.

In the above-described embodiment, semiconductor device 10 is described which outputs one set of the complementary data strobe signals. However, the number of sets of the complementary data strobe signals is not limited to one. The present invention is applicable to a semiconductor device configured to output a plurality of sets of the complementary data strobe signals. If a plurality of sets of the complementary data strobe signals are used, the same edge adjustment signal may be supplied to all the sets of the complementary data strobe signals or different edge adjustment signals may be supplied to the respective sets of the complementary data strobe signals. If different edge adjustment signals are supplied to the respective sets of the complementary data strobe signals, clock division circuit 301 and adjustment information holding circuit 530 will be provided for each set of the complementary edge adjustment signals.

In the above-described embodiment, each edge adjustment circuit 302 contains 2 P-type MOS capacitances and 2 N-type MOS capacitances. However, the number of the MOS capacitances is not limited to this value. An increase in the number of MOS capacitances enables more precise adjustment.

The above-described embodiment includes eight data terminals DQ0 to DQ7. However, the number of data terminals is not limited to this value.

In the above-described embodiment, each of the circuits shown in FIG. 1 operates using external voltage VDD as a power source. However, the following configuration is possible. An internal voltage generation circuit is further provided which is configured to utilize external voltage VDD to generate an internal voltage lower than external voltage VDD. Among the circuits shown in FIG. 1, for example, command decoder 32, address latch circuit 42, read and write control circuit 51, and DLL circuit 100 may operate using the generated internal voltage as a power source. In this case, a level shift circuit is desirably provided between DLL circuit 100 and clock division section 300 and between read and write control section 51 and data I/O section 400; the level shift circuit is configured to convert a signal with the same amplitude value as that of the internal voltage into a signal with the same amplitude value as that of external voltage VDD.

It is apparent that the present invention is not limited to the above embodiments, but may be modified and changed without departing from the scope and spirit of the invention.

What is claimed is:

1. A semiconductor device comprising:
   a clock generation circuit that generates a first internal clock signal based on an external clock signal;
   a clock division circuit that generates a second internal clock signal and a third internal clock signal based on the first internal clock signal, the clock division circuit including an edge adjustment circuit that adjusts a timing of at least one of a rising edge and a falling edge of the third internal clock signal based on an edge adjustment signal;
   an adjustment information holding section that supplies the edge adjustment signal to the edge adjustment circuit;
   a data strobe output circuit that receives the second and third internal clock signals to generate a first data strobe signal in response to the second internal clock signal, and to generate a second data strobe signal with a phase different from that of the first data strobe signal, in response to the third internal clock signal.

2. The semiconductor device according to claim 1, wherein the clock division circuit delays the first internal clock signal to generate the second internal clock signal.

3. The semiconductor device according to claim 1, wherein the clock division circuit further includes a generation circuit that generates a fourth internal clock signal and a fifth internal clock signal, the fourth and the fifth internal clock signals are different in phase from each other, and the edge adjustment circuit adjusts at least one of a rising time and a falling time of the fifth internal clock signal based on the edge adjustment signal.

4. The semiconductor device according to claim 3, wherein the clock division circuit further includes a first driver circuit that receives the fourth internal clock signal and that generates and supplies the second internal clock signal to the data strobe output circuit, and a second driver circuit that receives the fifth internal clock signal and that generates and supplies the third internal clock signal to the data strobe output circuit, and the edge adjustment circuit is arranged between the generation circuit and the second driver circuit.

5. The semiconductor device according to claim 4, wherein the second driver circuit provides rising and falling times of the third internal clock signals that are independent of a variation of the rising and falling times of the fifth internal clock signals.

6. The semiconductor device according to claim 3, wherein the edge adjustment circuit further includes:
   a signal line through which the fifth internal clock signal transfers; and
   a capacitive element connected to the signal line at one end thereof and receiving the edge adjustment signal at the other end thereof.

7. The semiconductor device according to claim 6, wherein the capacitive element has an adjustable capacitance value that is adjusted based on the edge adjustment signal.

8. The semiconductor device according to claim 6, wherein the capacitive element includes a transistor comprising a control electrode that is coupled to the signal line and first and second electrodes that are coupled to each other and receiving the edge adjustment signal.

9. A device comprising:
   a clock generation circuit configured to generate a first internal clock signal in response to an external clock signal;
   a clock division circuit including an input node that receives the first internal clock signal, and first and second output nodes, the clock division circuit being configured to produce a second internal clock signal at the first output node thereof in response to the first internal clock signal and a third internal clock signal at the second output node thereof in response to the first internal clock signal, the second clock generation circuit further including,
   first and second inverters coupled respectively to the first and second output nodes of the clock division circuit,
   a first signal line connecting the input node of the clock division circuit and the first inverter to each other,
   a second signal line connecting the input node of the clock division circuit and the second inverter to each other, and
   an edge adjustment circuit including a first capacitor that has a first electrode coupled to the second signal line and a second electrode,
   a first adjustment information holding circuit configured to supply a first adjustment signal to the second electrode of the first capacitor, and
   a data strobe output circuit configured to generate a data strobe signal in response to at least one of the second and third internal clock signals.

10. The device as claimed in claim 9, wherein the clock generation circuit comprises a DLL circuit.

11. The device as claimed in claim 9, wherein the first adjustment information holding circuit is configured to supply one of first and second power supply voltages to the second electrode of the first capacitor as the first adjustment signal.

12. The device as claimed in claim 9, wherein the first capacitor includes a first transistor having a gate coupled to the first electrode and source and drain coupled in common to the second electrode.

13. The device as claimed in claim 9, wherein the edge adjustment circuit of the clock division circuit further includes a second capacitor that has a third electrode coupled to the second signal line and a fourth electrode, and the device further comprises a second adjustment information holding circuit configured to supply a second adjustment signal to the fourth electrode of the second capacitor.

14. The device as claimed in claim 13, wherein the first adjustment information holding circuit is configured to supply one of first and second power supply voltages to the second electrode of the first capacitor as the first adjustment signal and the second adjustment information holding circuit is configured to supply one of the first and second power supply voltages to the fourth electrode of the second capacitor as the second adjustment signal.

15. The device as claimed in claim 13, wherein the first capacitor includes a first transistor having a first gate coupled to the first electrode and first source and first drain coupled in common to the second electrode and the second capacitor includes a first transistor having a second gate coupled to the third electrode and second source and second drain coupled in common to the fourth electrode.

16. The device as claimed in claim 15, wherein the first transistor comprises a first channel type and the second transistor comprises a second channel type that is different from the first channel type.

17. The device as claimed in claim 13, wherein the clock generation circuit comprises a DLL circuit.

* * * * *